United States Patent [19]

Ueno et al.

[11] Patent Number: 4,741,920

[45] Date of Patent: May 3, 1988

[54] MESH AND PRINTING SCREEN FOR SCREEN PRINTING AND A METHOD FOR THE PREPARATION THEREOF

[76] Inventors: Susumu Ueno, 9809-7, Yatabe, Hazaki-cho; Toru Nakanishi, 3-3-24, Shitte-chuo, Kamisu-cho, both of Kashima-gun, Ibaraki-ken; Kenji Fushimi, 6-26-12, Maebara-higashi, Funabashi-shi, Chiba-ken; Keiichi Ishikawa, 786-46, Nase-cho, Totsuka-ku, Yokohama-shi, Kanagawa-ken; Yasuo Emori, 1-328-16, Tenjin-cho, Kodaira-shi, Tokyo-to, all of Japan

[21] Appl. No.: 883,172

[22] Filed: Jul. 8, 1986

[30] Foreign Application Priority Data

| | | |
|---|---|---|
| Jul. 9, 1985 [JP] | Japan | 60-151087 |
| Jul. 9, 1985 [JP] | Japan | 60-151088 |
| Jul. 12, 1985 [JP] | Japan | 60-153790 |
| Jul. 15, 1985 [JP] | Japan | 60-155858 |
| Aug. 8, 1985 [JP] | Japan | 60-174799 |
| Aug. 8, 1985 [JP] | Japan | 60-174800 |

[51] Int. Cl.$^4$ .............................................. B05D 3/06
[52] U.S. Cl. ...................................... 427/40; 430/308
[58] Field of Search ........................... 427/40, 39, 38; 430/308

[56] References Cited

U.S. PATENT DOCUMENTS

| | | | |
|---|---|---|---|
| 3,477,902 | 11/1969 | Tomasino et al. | 427/38 |
| 4,072,769 | 2/1978 | Lidel | 427/38 |
| 4,154,614 | 5/1979 | Tsunoda et al. | 430/308 |
| 4,302,528 | 11/1981 | Sano et al. | 430/308 |
| 4,466,258 | 8/1984 | Sando et al. | 427/38 |

*Primary Examiner*—John H. Newsome

[57] ABSTRACT

A greatly improved printing screen used for screen printing is provided in respect of the durability in printing, resistance against solvents and antistatic performance based on a mesh of polyester or nylon filaments. According to the invention, the base mesh is subjected to exposure to low temperature plasma of an inorganic gas prior to coating with a photosensitive resin composition in the form of an aqueous emulsion. When the plasma-treated mesh is coated, prior to coating with the photosensitive resin emulsion, with a surface active agent or when the photosensitive resin emulsion is admixed with a surface active agent, further improvement can be obtained in the antistatic performance of the screen. When a base screen dyed in yellow is used, the drawbacks caused by halation in the pattern-wise exposure of the screen to light can be greatly reduced.

2 Claims, No Drawings

MESH AND PRINTING SCREEN FOR SCREEN PRINTING AND A METHOD FOR THE PREPARATION THEREOF

BACKGROUND OF THE INVENTION

The present invention relates to an improved mesh and a printing screen for screen printing prepared with the mesh as well as a method for the preparation thereof. More particularly, the invention relates to a mesh for the preparation of a printing screen for screen printing having improved adhesion between the mesh and the photosensitive resin layer along with remarkably improved durability in screen printing therewith as well as a method for the preparation thereof.

As is known, the process of screen printing is performed by use of a printing screen prepared by providing a photosensitive resinous layer on a fine mesh made of filaments, of which the photosensitive layer is patterned by the photolithographic techniques. The meshes for such a printing screen were traditionally made of silk or very fine stainless steel wires. These traditional materials have several disadvantages. For example, silk-made meshes are defective in respect of the strength and dimensional stability while stainless steel-made meshes are not satisfactory in respect of elastic recovery and instantaneous repulsiveness if not to mention the expensiveness of both of these materials. In this regard, these traditional materials are being replaced more and more with filaments of polyester or nylon or, in particular, polyester utilizing their high dimensional stability. The meshes made of the filaments of these synthetic resins are of course not free from some problems including the poor receptivity of the photosensitive emulsion to form a photosensitive resinous layer on the mesh so that a uniform and sufficiently thick photosensitive layer can be formed only by repeating the coating works requiring handicraft-like skillfulness of the workers. Moreover, the adhesion of the thus formed photosensitive resinous layer to the surface of the mesh is low and poorly resistant against organic solvents used in the course of the printing works with the screen so that the durability of the printing screen is usually unsatisfactory.

Various attempts and proposals have been made in the prior art to solve the above described problems in the polyester or nylon-made mesh or printing screen made thereof including a chemical treatment of the mesh with an acid or alkali and physical treatment of the mesh with flame of corona discharge although no practically satisfactory results have yet been obtained rather with a disadvantage of decrease in the mechanical strength of the mesh.

SUMMARY OF THE INVENTION

The present invention therefore has an object to provide an improved polyester or nylon-made mesh or printing screen made thereof free from the above described problems and disadvantages in the conventional products as well as a method for the preparation of such a mesh or printing screen.

Thus, the method of the invention for the preparation of a mesh having improved properties for printing screen used in screen printing comprises subjecting a mesh made of filaments of a polyester or nylon, prior to coating with a photosensitive resinous composition, to a treatment by exposure to low temperature plasma generated in an atmosphere of an inorganic gas under a pressure in the range from 0.005 to 10 Torr. The low temperature plasma treatment should be performed preferably to such an extent that the surface of the mesh after the treatment may be wettable with a test solution having a wetting tension of 40 dyn/cm or higher.

In the coating procedure of the thus plasma-treated mesh with a photosensitive resinous composition in the form of an aqueous emulsion, it has been discovered that the adhesion between the surface of the mesh filaments and the photosensitive resin can be improved by coating the plasma-treated mesh with a surface active agent. Alternatively, a similar effect can be obtained when the photosensitive emulsion is admixed with a surface active agent.

DETAILED DESCRIPTION OF THE PREFERRED EMBODIMENTS

The base material for the preparation of the mesh is a meshed plain-woven cloth made of filaments of polyester or nylon having a diameter of 20 to 60 $\mu$m and having a fineness of at least 100 mesh openings or, preferably, in the range from 200 to 500 mesh openings per inch depending on the desired precision of printing. According to the conventional procedure, the mesh as woven is first cleaned by washing with a washing bath containing a non-ionic or anionic surface active agent at a temperature of 60° to 80° C. followed by rinse with water, a heat treatment at 150° to 170° C. and tensioning to give a desired thickness and mesh number.

The base mesh of polyester or nylon filaments is then subjected to a treatment with low temperature plasma of an inorganic gas so that the mesh is imparted with greatly improved hydrophilicity and increased adhesive bonding strength with a photosensitive resin usually applied to the mesh in the form of an aqueous emulsion. The low temperature plasma treatment of the base mesh is performed by holding the mesh in a chamber for plasma generation and impressing a high-frequency electric power at a frequency of 10 kHz to 100 MHz between the electrodes while the atmosphere inside the plasma chamber is kept under a pressure of 0.005 to 10 Torr by the balance of continuous evacuation and continuous introduction of an inorganic gas. It is of course that the frequency band of the power is not limited to the high-frequency range but can be direct current, low fequency or microwaves.

The electrodes should preferably be installed inside the plasma chamber though not particularly limitative thereto. For example, the electrodes can be installed outside the plasma chamber or a single work-coil electrode surrounding the plasma chamber may be used. At any rate, it is important that the mesh under the plasma treatment is free from the thermal influence by the heat of electric discharge in order to avoid any thermal denaturation of the material forming the mesh. A variety of electrode designs are possible. For example, the form of the electrodes is not particularly limitative including plate-like, ring-like, rod-like and cylindrical ones. The grounded and power electrodes may be of the same form or may be different forms from each other. A convenient design is that the metal-made walls of the plasma chamber may serve as the grounded electrode with one or more power electrodes installed therein. The power electrode is usually made of a metal such as copper, iron, aluminum and the like. It is preferable in order to ensure stability of the plasma discharge that the surface of at least the power electrode is provided with an insulating coating having a withstand voltage of 10000 volts or higher formed of a heat-resistant material such as glass, porcelain enamel, ceramic and the like. Rod-like electrodes provided with an insulating coating layer are preferable in respect of the efficiency in the generation of effective localized plasma.

The electric power to be impressed between the electrodes should be adequately selected in consideration of the effect to be obtained and the desirable length of time within which the treatment should be completed. The treatment can be complete within a shorter time when the electric power is larger as a matter of course. When the material of the filaments of the mesh under treatment is polyester, the power should be relatively large due to the high heat resistance of polyester resins in comparison with nylons although the electric power should be limited within a range not to cause thermal decomposition and denaturation of the mesh by the heat evolved by the plasma discharge. The electric power should be controlled relative to the power density on the surface of the power electrode and a power density of at least 5 kilowatts/m$^2$ is desirable from the standpoint of the working efficiency.

The inorganic gases suitable for supporting the plasma discharge inside the plasma chamber include helium, neon, argon, nitrogen, nitrous oxide, nitrogen dioxide, oxygen, air, carbon monoxide, carbon dioxide, hydrogen, chlorine, hydrogen chloride, sulfur dioxide, hydrogen sulfide and the like. These gases may be used either singly or as a mixture of two kinds or more according to need.

The pressure of the atmosphere inside the plasma chamber should be maintained in the range from 0.005 to 10 Torr or, preferably, in the range from 0.1 to 10 Torr. When the pressure is too low, the desired effect of improvement cannot be fully obtained in the adhesion between the mesh and the photosensitive resin applied thereto. An excessively high pressure, on the other hand, is undesirable due to the difficulty in maintaining the plasma discharge with stability.

When adequately treated with low temperature plasma, marked improvements can be obtained in the surface properties of the filaments forming the mesh such as the increased hydrophilicity and adhesive bonding strength of the photosensitive resin applied thereto. In this regard, the adequateness of the extent of plasma treatment can be estimated in terms of the wettability of the surface. A procedure to test the wettability is performed according to JIS K 6768 by spreading one of the test solutions in series prepared by mixing ethyleneglycol monoethyl ether and formamide in varied mixing ratios using a cotton applicator and visually examining the condition of the liquid film after a length of time on the mesh with the respective test solutions to record the particular test solution which can wet the mesh while no wetting can be obtained with a test solution containing formamide in a smaller mixing ratio than in the particular wettable test solution. The wetting tension of the particular wettable test solution at 23° C. in dyn/cm is referred to as the wettability index of the mesh hereinbelow. In this regard, it is preferable that the plasma treatment should be performed until the surface of the treated mesh is wettable with a test solution having a wetting tension of 40 dyn/cm or higher or has a wettability index of 40 or higher.

The thus plasma-treated mesh of polyester or nylon filaments is then coated with a photosensitive resin composition in the form of an aqueous emulsion after washing and drying of the mesh to prepare a printing screen for photolithographic screen-making process. Commercially available photosensitive resin emulsions are generally usable in this case containing a base resin such as gelatin, gum arabic, polyvinyl alcohol, polyvinyl acetate, acrylic resins and the like as well as mixtures thereof and a photosensitizer such as a bichromate, e.g. ammonium bichromate or a diazo compound. The photosensitive resin emulsion may contain various known additives such as emulsifiers, antistatic agents and others according to need.

Although the thickness of the coating layer of the photosensitive resin composition on the plasma-treated mesh should of course be controlled depending on the particularly intended application of the printing screen, the most remarkable advantage obtained by the plasma treatment of the mesh is the high uniformity in the thickness of the coating layer which can easily be attained in comparison with the same mesh before the plasma treatment. The thickness of the photosensitive coating layer is usually in the range from 3 to 15 $\mu$m as dried. When a single coating is not sufficient to provide a coating layer having such a thickness, the coating work should be repeated after the previous coating has been dried nearly to completion. By virtue of the increased hydrophilicity of the surface of the polyester or nylon filament imparted by the plasma treatment, a single coating with a photosensitive emulsion may be sometimes sufficient to form a photosensitive coating layer having a desired thickness.

The plasma-treated mesh of polyester or nylon filaments coated with a photosensitive resin composition is, after drying, then subjected to patterning to prepare a desired printing screen by the techniques of photolithography for patterning. The conditions of the patterning photolithographic exposure naturally depend widely on the nature of the photosensitive resin composition on the mesh. In a typical example, the light source is a high-pressure mercury lamp or a xenon lamp having an output of about 4 kilowatts held at a distance of 1 to 1.5 meters from the screen and the exposure is performed for 2.5 to 6 minutes. The integral dose in this case is usually in the range from 400 to 700 mJ/cm$^2$.

The printing screen prepared in the above described manner according to the invention is very advantageous in respect of the adhesive bonding strength between the surface of the polyester or nylon filaments forming the mesh and the patterned resinous layer thereon as a result of the low temperature plasma treatment. Accordingly, the printing screen has greatly improved durability in printing. This is particularly so when the thickness of the photosensitive resin layer is very small in order to meet a requirement for extremely fine printing to give a line width of, for example, 0.25 mm or finer. For example, a line-wise pattern of the resinous layer having a width of 0.05 to 0.10 mm can be firmly held by the mesh. Further, the resinous layer is highly resistant against organic solvents used in the course of printing for cleaning the screen such as chlorinated hydrocarbon solvents, e.g. trichloroethylene and methylene chloride, ketones, e.g. acetone and methyl ethyl ketone, alcohols, e.g. methyl, ethyl and isopropyl alcohols, aromatic hydrocarbons, e.g. toluene and xylene, esters, e.g. ethyl and butyl acetates, monoalkyl ethers of ethylene glycol, e.g. ethylene glycol monoethyl and monobutyl ethers, cyclohexane and so on. This is a great advantage in the screen printing because the working efficiency in the conventional process of screen printing is unavoidably subject to the drawback caused by the peeling of the patterned resinous layer when the printing screen is washed with an organic solvent to remove the printing ink thereon.

As is mentioned before, the antistatic performance of the printing screen prepared by use of the plasma-treated mesh can be further improved when the plasma-treated mesh is coated, prior to application of the photosensitive resin emulsion, with a surface active agent. The type of the surface active agent used for this purpose is not particularly limitative including, anionic, cationic, non-ionic and amphoteric ones.

Suitable cationic surface active agents are exemplified by a variety of derivatives of quaternary ammonium salts such as long-chain alkyl trimethyl ammonium salts, long-chain alkyl dimethyl benzyl ammonium salts and the like and long-chain alkyl amine sulfates, e.g. octadecylamine sulfate. Anionic surface active agents are exemplified by sulfonated oils, metal soaps, sulfonated ester oils, sulfonated amide oils, sulfonated ester salts of olefins, sulfonated ester salts of aliphatic alcohols, salts of alkylsulfate esters, sulfonate salts of ethyl carboxylates, salts of alkyl sulfonates, salts of alkyl sulfinates, salts of alkyl naphthalene sulfonates, salts of alkyl benzene sulfonates, reaction products of naphthalene sulfonic acid and formaldehyde, reaction products of succinate ester sulfonic acid and formaldehyde, salts of succinate ester sulfonic acids, esters of phosphoric acid and the like. The non-ionic surface active agents are exemplified by fatty acid esters of polyhydric alcohols, ethylene oxide addition products of aliphatic alcohols, ethylene oxide addition products of aliphatic amines or aliphatic amides, ethylene oxide addition products of alkyl phenols, ethylene oxide addition products of partial fatty acid esters of polyhydric alcohols, polyethylene glycols and the like. The amphoteric surface active agents are exemplified by betaine derivatives, sulfate esters of imidazoline, e.g. hydroxyethyl imidazoline sulfate, sulfonates, e.g. imidazoline sulfonate, and the like. Among the above named types of surface active agents, the largest effects can be obtained in respect of the antistatic performance by use of a cationic surface active agent if it is not prohibitive in relation to the nature of the photosensitive resin to be applied to the mesh.

The surface active agent is usually dissolved in water in a concentration of 0.1% by weight or larger and the plasma-treated mesh is coated with the aqueous solution by any known method such as brush coating, roller coating, spraying, dipping and the like followed by drying before coating with a photosensitive resin emulsion or bonding of two meshes together.

A similar antistatic effect can be obtained when the aqueous emulsion of the photosensitive resin to be applied to the plasma-treated mesh contains a surface active agent instead of coating the plasma-treated mesh with a surface active agent prior to application of the photosensitive resin emulsion. Suitable surface active agents may be the same as those given as the examples of the surface active agents used for coating of the mesh prior to application of the photosensitive resin emulsion. Cationic surface active agents are preferred also in this case. The amount of the surface active agent in the photosensitive resin emulsion should be in the range from 0.1 to 10% by weight or, preferably, from 0.5 to 5% by weight based on the content of the photosensitive resin in the aqueous emulsion. When the amount of the surface active agent in the emulsion is too large, a detrimental effect may be caused in the adhesive bonding of the photosensitive resin to the surface of the mesh.

It is a remarkable fact that the polyester or nylon-made filament mesh used for the preparation of a printing screen is used, without exception, as undyed in a white color. The inventors have become aware that the frequently encountered drawbacks in the patterned printing screens such as blur and fog are mainly due to the use of a white mesh responsible for halation of light in the layer of the photosensitive layer. Accordingly, the inventors have undertaken extensive investigations to solve this problem and have arrived at an unexpected discovery that the phenomenon of halation can greatly be reduced when the mesh is made of dyed filaments followed by the low temperature plasma treatment. It should be emphasized here that the mere use of a colored mesh is little advantageous from the standpoint of reducing the halation so that it is reasonable that no one has ever obtained remarkable improvement in this regard by the use of such a colored mesh notwithstanding the demand for reducing halation. After elaborate experimentation, a conclusion has been reached that the phenomenon of halation can be reduced most remarkably when the base mesh is dyed in yellow among other colors such as red, orange, brown, violet, green, blue and the like. Excepting the use of such a colored base mesh, the conditions for the low temperature plasma treatment may be identical with those in the treatment of white meshes.

Following are the examples to illustrate the mesh according to the present invention and a printing screen prepared of the meshes as well as a method for the preparation thereof in more detail.

EXAMPLE 1

Meshes made of undyed polyester filaments and having a fineness of 225 mesh openings and 300 mesh openings were placed in a plasma chamber of an apparatus for the low temperature plasma treatment and the chamber was evacuated to have a pressure of 0.01 Torr. Then, oxygen gas was continuously introduced into the chamber at such a rate that the pressure inside the chamber was maintained at 0.3 Torr by the balance with the continued evacuation. While keeping the above mentioned atmospheric conditions inside the chamber, a high-frequency electric power of 40 kilowatts at a frequency of 110 kHz was impressed between the electrodes installed inside the chamber so as to generate low temperature plasma to which the meshes were exposed for about 5 seconds.

Each of the thus plasma-treated meshes was washed in an aqueous washing solution containing 0.1% by weight of a neutral detergent followed by rinse with water and drying. Thereafter, the plasma-treated and untreated meshes were each repeatedly coated with a polyvinyl alcohol-polyvinyl acetate based photosensitive resin emulsion (NK-14, a product by Hoechst Co., West Germany) in a coating thickness of 10 to 12 μm as dried to give a printing screen suitable for photolithographic screen making.

The thus prepared photosensitive printing screen was exposed to light through a patterning mask having a checkerboard-like pattern of 20 lines and 50 rows formed of 1000 squares of each 0.5 mm by 0.5 mm wide. The light source was a high-pressure mercury lamp of 4 kilowatts output placed at a distance of 1.4 meters above the screen. The exposure was continued for 3 minutes to give an integral exposure dose of 400 mJ/cm². The exposed screen was developed by dipping in water for 3 minutes followed by spraying with water to wash away the resin on the unexposed areas. The printing screens provided with the checkerboard-like pattern of the resin layer as prepared in this manner were each evaluated by the test for peeling resistance with an adhesive tape and the test for the solvent resistance to give the results shown in Table 1 below. The testing procedures for these items were as follows.

Peeling resistance test with adhesive tape: an adhesive filament tape (#880, a product by Sumitomo MMM Co.) was applied and bonded to the patterned area of the screen and then the adhesive tape was peeled off the printing screen to count the number of the checkerboard squares which had been removed by being bonded to the lifted adhesive tape. This procedure was repeated three times and the number of the removed squares was recorded in each time per 1000 squares.

Solvent resistance test: the printing screen provided with the checkerboard-like pattern of the resin layer was dipped for 5 minutes in an organic solvent at 23° C. and pulled up from the solvent followed by drying and the number of the fallen squares was counted per 1000 squares. The organic solvent was trichloroethylene or methyl ethyl ketone referred to as TCE and MEK, respectively, hereinbelow.

EXAMPLE 2

The experimental procedure was substantially the same as in Example 1 except that the polyester meshes were replaced with an undyed nylon-made mesh having a fineness of 250 mesh openings and the thickness of the photosensitive resin layer applied to the plasma-treated and untreated meshes was 8 to 10 μm. The results of the peeling resistance test with an adhesive tape and the solvent resistance test were as shown in Table 2 below.

TABLE 1

| Fineness of mesh, meshes | Plasma treatment | Peeling test 1st | 2nd | 3rd | Solvent test TCE | MEK |
|---|---|---|---|---|---|---|
| 225 | Yes | 0 | 0 | 0 | 0 | 0 |
| 225 | No | 6 | 10 | 21 | 176 | 115 |
| 300 | Yes | 0 | 0 | 0 | 0 | 0 |
| 300 | No | 2 | 8 | 12 | 128 | 73 |

TABLE 2

| Fineness of mesh, meshes | Plasma treatment | Peeling test 1st | 2nd | 3rd | Solvent test TCE | MEK |
|---|---|---|---|---|---|---|
| 250 | Yes | 0 | 0 | 0 | 0 | 0 |
| 250 | No | 2 | 6 | 10 | 12 | 34 |

EXAMPLE 3

Meshes made of undyed polyester filaments and having a fineness of 180 mesh openings and 250 mesh openings were placed in a plasma chamber of an apparatus for the low temperature plasma treatment and the chamber was evacuated to have a pressure of 0.01 Torr. Then, oxygen gas was continuously introduced into the chamber at such a rate that the pressure inside the chamber was maintained at about 2 Torr by the balance with the continued evacuation. While keeping the above mentioned atmospheric conditions inside the chamber, a high-frequency electric power of 25 kilowatts at a frequency of 110 kHz was impressed between the electrodes installed inside the chamber so as to generate low temperature plasma to which the meshes were exposed for about 50 seconds.

Each of the thus plasma-treated meshes was washed in an aqueous washing bath containing 0.1% by weight of a neutral detergent followed by rinse with water and drying. Thereafter, the thus plasma-treated and untreated meshes were each repeatedly coated with a polyvinyl alcohol-polyvinyl acetate based photosensitive resin emulsion (NK-14, a product by Hoechst Co., West Germany) in a coating thickness of 18 to 20 μm as dried to give a printing screen suitable for photolithographic screen preparation which was subsequently subjected to exposure to light, development with water and tests for the peeling resistance and solvent resistance in the same manner as in Example 1 to give the results shown in Table 3 below. The wettability indices of the plasma-treated or untreated meshes are shown also in Table 3.

TABLE 3

| Fineness of mesh, meshes | Plasma treatment | Wettability index | Peeling test 1st | 2nd | 3rd | Solvent test TCE | MEK |
|---|---|---|---|---|---|---|---|
| 180 | Yes | 52 | 0 | 0 | 0 | 0 | 0 |
| 180 | No | 33 | 7 | 26 | 36 | 116 | 82 |
| 250 | Yes | 52 | 0 | 0 | 0 | 0 | 0 |
| 250 | No | 34 | 4 | 12 | 19 | 152 | 107 |

EXAMPLE 4

The experimental procedure was substantially the same as in Example 3 except that the polyester-made meshes were replaced with an undyed nylon-made mesh having a fineness of 300 mesh openings and the thickness of the photosensitive resin layer applied to the plasma-treated and untreated meshes was 16 to 18 μm. The results of the peeling resistance test with an adhesive tape and the solvent resistance test were as shown in Table 4 below.

EXAMPLE 5

A comparative test for durability in printing was undertaken using the printing screen prepared in Example 3 with the polyester base mesh of 250 mesh fineness, of which the photosensitive resin layer had a thickness of 18 μm. As a control, another printing screen was prepared in just the

TABLE 4

| Fineness of mesh, meshes | Plasma treatment | Wettability index | Peeling test 1st | 2nd | 3rd | Solvent test TCE | MEK |
|---|---|---|---|---|---|---|---|
| 300 | Yes | 50 | 0 | 0 | 0 | 0 | 0 |
| 300 | No | 31 | 2 | 3 | 9 | 8 | 30 | same manner as above excepting the omission of the low temperature plasma treatment. The testing procedure was as follows. Thus, each of the printing screens was gently rubbed repeatedly with a cloth wet with an organic solvent and the number of rubbing was recorded when falling of the checkerboard squares took place. The organic solvents used in this test were trichloroethylene, ethyleneglycol monoethyl ether and methyl ethyl ketone referred to as TCE, EGE and MEK, respectively. The results are shown in Table 5 below.

TABLE 5

| Plasma treatment | Organic solvent | | |
| --- | --- | --- | --- |
| | TCE | EGE | MEK |
| Yes | (No falling of squares by 600 times rubbing) | | |
| No | 250 times | 180 times | 310 times |

EXAMPLE 6

Meshes made of yellow-dyed polyester filaments and having fineness of 180 mesh openings, 225 mesh openings and 300 mesh openings were placed in a plasma chamber of an apparatus for the low temperature plasma treatment and the chamber was evacuated to have a pressure of 0.01 Torr. Then, oxygen gas was continuously introduced into the chamber at such a rate that the pressure inside the chamber was maintained at 0.9 Torr by the balance with the continued evacuation. While keeping the above mentioned atmospheric conditions inside the chamber, a high-frequency electric power of 40 kilowatts at a frequency of 110 kHz was impressed between the electrodes installed inside the chamber so as to generate low temperature plasma to which the meshes were exposed for about 15 seconds.

Each of the thus plasma-treated meshes was processed in the same manner as in Example 1 and provided with a coating layer of the same photosensitive resin in a coating thickness of 10 to 12 μm as dried to give a printing screen along with the preparation of further screens using base meshes before the low temperature plasma treatment. The printing screens were exposed to light in the same manner as in Example 1 except that the exposure time was 3.5 minutes instead of 3 minutes and subjected to the tests of peeling resistance and solvent resistance to give the results shown in Table 6 below.

A microscopic examination was undertaken of these patterned printing screens and similar screens prepared of white base screens with the low temperature plasma treatment and those prepared of the same yellow-dyed base meshes but with omission of the low temperature plasma treatment to reveal that the highest sharpness of the checkerboard pattern was obtained when the printing screen was prepared of the yellow-dyed mesh with the low temperature plasma treatment.

TABLE 6

| Fineness of mesh, meshes | Plasma treatment | Peeling test | | | Solvent test | |
| --- | --- | --- | --- | --- | --- | --- |
| | | 1st | 2nd | 3rd | TCE | MEK |
| 180 | Yes | 0 | 0 | 0 | 0 | 0 |
| 180 | No | 4 | 13 | 20 | 148 | 68 |
| 225 | Yes | 0 | 0 | 0 | 0 | 0 |
| 225 | No | 6 | 25 | 40 | 161 | 78 |
| 300 | Yes | 0 | 0 | 0 | 0 | 0 |
| 300 | No | 4 | 7 | 16 | 142 | 53 |

EXAMPLE 7

The experimental procedure was substantially the same as in Example 6 except that the yellow-dyed polyester-made meshes were replaced with a yellow-dyed nylon-made mesh having a fineness of 300 mesh openings and the thickness of the photosensitive resin layer applied to the plasma-treated and untreated meshes was 8 to 10 μm. The results of the peeling test with an adhesive tape and the solvent resistance test were as shown in Table 7 below.

TABLE 7

| Fineness of mesh, meshes | Plasma treatment | Peeling test | | | Solvent test | |
| --- | --- | --- | --- | --- | --- | --- |
| | | 1st | 2nd | 3rd | TCE | MEK |
| 300 | Yes | 0 | 0 | 0 | 0 | 0 |
| 300 | No | 2 | 4 | 7 | 5 | 30 |

EXAMPLE 8

The experimental procedure was about the same as in Example 7 except that the yellow-dyed polyester-made base meashes had fineness of 250 mesh openings and 300 mesh openings and the high frequency electric power was 25 kilowatts instead of 40 kilowatts. Table 8 below summarizes the wettability indices of the meshes before and after the low temperature plasma treatment and the results of the peeling resistance test and the solvent resistance test undertaken in the same manner as in Example 1.

Instead of the checkerboard pattern, the 300 mesh screens prepared above were each provided with a line-and-space pattern having a line width of 0.10 mm in the same manner as above and microscopically examined to find that the patterned lines clearly had higher sharpness when the base mesh was subjected to the low temperature plasma treatment than without the plasma treatment.

TABLE 8

| Fineness of mesh, meshes | Plasma treatment | Wettability index | Peeling test | | | Solvent test | |
| --- | --- | --- | --- | --- | --- | --- | --- |
| | | | 1st | 2nd | 3rd | TCE | MEK |
| 250 | Yes | 50 | 0 | 0 | 0 | 0 | 0 |
| 250 | No | 31 | 16 | 31 | 71 | 828 | 497 |
| 300 | Yes | 50 | 0 | 0 | 0 | 0 | 0 |
| 300 | No | 31 | 24 | 38 | 46 | 552 | 304 |

EXAMPLE 9

The low temperature plasma treatment of undyed polyester-made base meshes was performed under the same conditions as in Example 1 except that the base meshes had fineness of 180 mesh openings and 250 mesh openings. The thus plasma-treated base meshes were each dipped in an aqueous solution containing 1% by weight of an aliphatic amine quaternary ammonium salt as a cationic surface active agent (Efcol 70, a product by Matsumoto Yushi Co.) and dried. Thereafter, the meshes were each coated with the same photosensitive resin emulsion in the same manner as in Example 1 to give a coating thickness of 10 to 12 μm as dried. The patterning by exposure to light and evaluation of the patterned printing screens were performed in the same manner as in Example 1 to give the results shown in Table 9 below.

TABLE 9

| Fineness of mesh, meshes | Plasma treatment | Peeling test | | | Solvent test | |
| --- | --- | --- | --- | --- | --- | --- |
| | | 1st | 2nd | 3rd | TCE | MEK |
| 180 | Yes | 0 | 0 | 0 | 0 | 0 |
| 180 | No | 16 | 25 | 38 | 121 | 80 |
| 250 | Yes | 0 | 0 | 0 | 0 | 0 |
| 250 | No | 5 | 17 | 25 | 183 | 112 |

A further screen was prepared using the polyester-made base mesh of 250 mesh fineness in substantially the same manner as above except that the aqueous solution of the cationic surface active agent was replaced with an aqueous solution of a tetraethylene oxide lauryl ether as a non-ionic surface active agent (K-204, a product by Nippon Yushi Co.) in the same concentration. Each of the thus prepared printing screens was subjected to the measurement of the surface resistivity using an insulation resistance tester either as prepared or after three and five times repeated dipping in trichloroethylene each time for 5 minutes followed by drying. The results are shown in Table 10.

TABLE 10

| Surface active agent | Surface resistivity, ohms | | |
|---|---|---|---|
| | As prepared | Times of dipping in TCE | |
| | | 3 | 5 |
| None | $1.1 \times 10^{13}$ | — | — |
| Cationic | $3.2 \times 10^{10}$ | $8.3 \times 10^{10}$ | $2.8 \times 10^{11}$ |
| Non-ionic | $5.2 \times 10^{11}$ | $9.2 \times 10^{11}$ | $3.2 \times 10^{12}$ |

EXAMPLE 10

The experimental procedure for the preparation of screens was substantially the same as in Example 9 except that the polyester-made base meshes were replaced with nylon-made meshes having fineness of 250 mesh openings and 270 mesh openings and the thickness of the photosensitive resin layer formed on the base mesh was 8 to 10 μm. Table 11 below summarizes the results of the tests for the peeling resistance and solvent resistance.

TABLE 11

| Fineness of mesh, meshes | Plasma treatment | Peeling test | | | Solvent test | |
|---|---|---|---|---|---|---|
| | | 1st | 2nd | 3rd | TCE | MEK |
| 250 | Yes | 0 | 0 | 0 | 0 | 0 |
| 250 | No | 3 | 10 | 21 | 10 | 36 |
| 270 | Yes | 0 | 0 | 0 | 0 | 0 |
| 270 | No | 2 | 9 | 15 | 8 | 35 |

EXAMPLE 11

A mesh made of undyed polyester filaments and having a fineness of 250 mesh openings was placed in a plasma chamber of an apparatus for the low temperature plasma treatment and the chamber was evacuated to have a pressure of 0.01 Torr. Then, argon gas was continuously introduced into the chamber at such a rate that the pressure inside the chamber was maintained at 0.1 Torr by the balance with the continued evacuation. While keeping the above mentioned atmospheric conditions inside the chamber, a high-frequency electric power of 25 kilowatts at a frequency of 110 kHz was impressed between the electrodes installed inside the chamber so as to generate low temperature plasma to which the mesh was exposed for about 5 seconds.

The thus plasma-treated mesh was processed in the same manner as in Example 1 to be provided with a layer of a photosensitive resin having a thickness of 10 to 12 μm except that the photosensitive resin emulsion applied to the mesh was admixed with the same cationic surface active agent or the same non-ionic surface active agent as used in Example 9 each in an amount of 1% by weight based on the resin content in the emulsion. The patterning of the screens was performed also in the same manner as in Example 1.

Each of the thus prepared printing screens was subjected to the measurement of the surface resistivity either as prepared or after three and five times repeated dipping in trichloroethylene in the same manner as in Example 9. The results are shown in Table 12.

TABLE 12

| Surface active agent | Surface resistivity, ohms | | |
|---|---|---|---|
| | As prepared | Times of dipping in TCE | |
| | | 3 | 5 |
| None | $1.1 \times 10^{13}$ | — | — |
| Cationic | $7.5 \times 10^{9}$ | $3.1 \times 10^{10}$ | $7.6 \times 10^{10}$ |
| Non-ionic | $1.4 \times 10^{10}$ | $9.8 \times 10^{10}$ | $3.2 \times 10^{11}$ |

The above described printing screens patterned in a checkerboard pattern as prepared with admixture of the cationic surface active agent to the photosensitive resin emulsion was subjected to the test of the peeling resistance. In this case, the adhesive tape was repeatedly applied and bonded to the surface of the screen to bridge the areas with and without the resin layer and peeled off to record the number of the repeated cycles of bonding and peeling required for removing the patterned resin layer. Further, the same peeling test was undertaken of the screens after dipping for 5 minutes in trichloroethylene or ethyl acetate. The number of the repeated peeling was 3 for the screen as prepared and 2 for the screen after dipping in the solvent when the screen was prepared with the low temperature plasma treatment while a similar screen prepared with admixture of the surface active agent to the photosensitive resin emulsion by omitting the low temperature plasma treatment was not resistant to the peeling test of the adhesive tape to cause complete falling of the resin layer on the mesh even by a single peeling.

EXAMPLE 12

The procedure for the preparation of the printing screens was substantially the same as in Example 10 except that the polyester-made base mesh was replaced with a nylon-made mesh of the same fineness. The results of the measurement of the surface resistivity undertaken in the same manner as in Example 9 were as shown in Table 11 below.

TABLE 13

| Surface active agent | Surface resistivity, ohms | | |
|---|---|---|---|
| | As prepared | Times of dipping in TCE | |
| | | 3 | 5 |
| None | $1.3 \times 10^{13}$ | — | — |
| Cationic | $7.5 \times 10^{9}$ | $1.3 \times 10^{10}$ | $2.1 \times 10^{10}$ |
| Non-ionic | $1.2 \times 10^{10}$ | $5.8 \times 10^{10}$ | $1.4 \times 10^{11}$ |

What is claimed is:

1. A method for the preparation of a printing screen used in screen printing which comprises the steps of:
   (a) subjecting a mesh made of filaments of polyester or nylon to a treatment by exposure to low temperature plasma generated in an atmosphere of inorganic gas under a pressure in the range from 0.005 to 10 Torr;
   (b) coating the plasma-treated mesh with a surface active agent; and
   (c) coating the thus plasma-treated mesh with a photosensitive resin composition in the form of an aqueous emulsion.

2. A method for the prepartion of a printing screen used in screen printing which comprises the steps of:
   (a) subjecting a mesh made of filaments of polyester or nylon to a treatment by exposure to low temperature plasma generated in an atmosphere of inorganic gas under a pressure in the range from 0.005 to 10 Torr;
(b) coating the plasma-treated mesh with a cationic surface active agent; and
(c) coating the thus plasma-treated mesh with a photosensitive resin composition in the form of an aqueous emulsion.

* * * * *

UNITED STATES PATENT AND TRADEMARK OFFICE
CERTIFICATE OF CORRECTION

PATENT NO. : 4,741,920

DATED : May 3, 1988

INVENTOR(S) : Ueno, Susumu; Nakanishi, Toru; Fushimi, Kenji; Ishikawa, Keiichi; Emori, Yasuo It is certified that error appears in the above-identified patent and that said Letters Patent is hereby corrected as shown below:

On the cover page of the patent, insert under "inventors" entry, -- Assignees: Shin-Etsu Chemical Co., Ltd., 6-1 Otemachi, 2-chome, Chiyoda-ku, Tokyo, Japan, (2) Akebono Sangyo Co., Ltd., 196-2, Kawawa-cho, Midori-ku, Yokohama-shi, Kanagawa-ken, Japan, and (3) Nippon Tokushu Fabric Corp., 9-1, Shinpo, Arado-Machi, Katsyama-shi, Fukui-ken, Japan.--

Signed and Sealed this

Fourth Day of October, 1988

Attest:

DONALD J. QUIGG

*Attesting Officer*   *Commissioner of Patents and Trademarks*